United States Patent [19]

Neisser

[11] Patent Number: 5,563,012
[45] Date of Patent: Oct. 8, 1996

[54] MULTI MASK METHOD FOR SELECTIVE MASK FEATURE ENHANCEMENT

[75] Inventor: Mark O. Neisser, Wappingers Falls, N.Y.

[73] Assignee: International Business Machines Corporation, Armonk, N.Y.

[21] Appl. No.: 269,853

[22] Filed: Jun. 30, 1994

[51] Int. Cl.⁶ ........................................................ G03F 9/00
[52] U.S. Cl. .................................. 430/22; 430/5; 430/394; 430/311; 430/312
[58] Field of Search .................................... 430/5, 22, 311, 430/312, 394

[56] References Cited

U.S. PATENT DOCUMENTS

| | | | |
|---|---|---|---|
| 3,890,148 | 6/1975 | Lawson et al. | 96/33 |
| 4,374,911 | 2/1983 | Hartley | 430/5 |
| 4,504,558 | 3/1985 | Bohlen et al. | 430/30 |
| 4,774,158 | 9/1988 | Vervoordeldonk et al. | 430/30.1 |
| 5,286,584 | 2/1994 | Gemmick et al. | 430/5 |

FOREIGN PATENT DOCUMENTS 60-167328  8/1985  Japan.

OTHER PUBLICATIONS

J. Garofalo, et al., "Mask Assisted Off–Axis Illumination Technique for Random Logic" J. Vac. Sci. Technology B, vol. 11, #6, pp. 2651–2658, Nov./Dec. 1993.

*Primary Examiner*—S. Rosasco
*Attorney, Agent, or Firm*—Charles W. Peterson, Jr.; Susan M. Murray

[57] ABSTRACT

The preferred embodiment of the present invention is a method of enhancing normally unenhanced features types. Pattern shapes are placed on two or more relatively simple, modified masks instead of using a single mask containing diverse feature types. On these modified masks, (hereinafter "overlay masks"), all of the features are the type normally enhanced. A composite pattern is printed into photoresist through successive exposure to the overlay masks.

13 Claims, 1 Drawing Sheet

MULTI MASK METHOD FOR SELECTIVE MASK FEATURE ENHANCEMENT

FIELD OF THE INVENTION

The present invention generally relates to masking techniques for fine feature lithography and more particularly to integrated circuit masking techniques of circuit features for enhancing the masked image resolution or depth of focus (DOF) in photoresists.

BACKGROUND OF THE INVENTION

There are four major types of mask image features. They are line/space arrays, isolated lines, isolated spaces, and contact holes. A common problem encountered in lithography methods is that prior art resolution or DOF image-enhancement techniques do not uniformly enhance all four major types. Instead, prior art techniques provide best enhancement for specific major feature types so that some features are enhanced relative to others in the same design pattern. These fully enhanced feature types are referred to hereinafter as enhanced. Features not fully enhanced by a particular technique are referred to hereinafter as unenhanced. Because prior art techniques favor selectively enhanced particular features types, uniform mask image enhancement for mixed design patterns, i.e., with many feature types, is very difficult.

The well-known off-axis illumination method, for example, enhances closely spaced pattern images such as line/space arrays much more than isolated features or contact holes. By contrast, the attenuated Phase Shift Mask (PSM) method, results in better resolution and DOF for isolated features and contact holes than for line/space arrays. The Rim PSM method is similar to the attenuated PSM method in the feature types enhanced. Prior art image enhancement techniques generally provide only selective enhancement of certain feature types which do not result in uniform image enhancement, or pose considerable design and/or manufacturability difficulties.

PURPOSES OF THE INVENTION

It is a purpose of the present invention to enhance features of images uniformly for patterns having diverse feature types.

It is another purpose of the present invention to improve the resolution or DOF of selected features to form enhanced images in photoresist on masks with diverse feature types.

SUMMARY OF THE INVENTION

The preferred embodiment of the present invention is a method of image enhancement of a pattern having diverse feature types, the method comprising: grouping pattern shapes into a plurality of shape groups according to feature type, including at least one enhanced feature group and at least one relatively unenhanced feature group; forming a plurality of overlay groups from at least one unenhanced feature group; and, forming a plurality of overlay mask images, each overlay mask image including a different one of the plurality of overlay groups, and, one of the overlay masks including at least one enhanced feature group. Successive exposures of each mask image without intermediate development of the resist provide enhanced resolution and/or depth of focus for at least one feature group over what could be achieved using one mask and exposure. In one embodiment, the overlay groups interleave to form an array when the overlay masks are overlain. In a second embodiment, the overlay groups merge to form a uniform exposure resulting in only isolated features.

BEST MODE FOR CARRYING OUT THE INVENTION

The preferred embodiment of the present invention is a method of enhancing normally unenhanced features. Pattern shapes are placed on two or more modified masks. Because of careful selection of shapes placed on each mask, each modified mask has fewer types of features than the original design pattern. The original design pattern contained more diverse feature types than the modified masks. On these modified masks, all of the features are the type normally enhanced by the chosen lithography technique. A composite pattern is printed into photoresist through successive exposures through the modified masks, hereinafter "overlay masks".

In the preferred embodiment method of the present invention, for attenuated phase-shift masks or for rim phase shift masks, notice is taken that isolated features and contact hole images normally are enhanced relative to line/space array features present in the same mask pattern. Alternatively, for off axis illumination masks, notice is taken that line/space array features are enhanced relative to isolated features and contact holes.

In accordance with the invention, the shapes in the enhanced feature types are grouped into one or more groups. Then, normally unenhanced shapes, for example line/space array features, are grouped into two or more overlay groups. The overlay groups are formed either by selectively dividing the unenhanced shapes between overlay groups or by creating dummy shapes that form the unenhanced shapes and, then, selectively dividing the dummy shapes between overlay groups. Thus, each overlay group is a group of enhanced features (isolated shapes in this example). Each overlay group is formed on an overlay mask. The composition image, formed from the successive exposure of the overlay masks on the same photoresist, is the original undivided pattern but, with relatively uniform enhancement for most or all features, normally achieved for only selected feature types.

Figure 1:
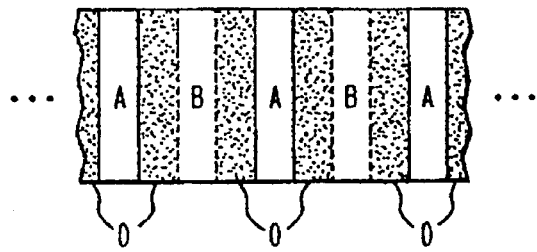
FIG. 1 is a simplified plan view of a portion of a mask design characterized by a line/space array feature type to be subdivided into a pair of modified masks in accordance with the present invention.

FIG. 1 represents a line/space array portion of a larger design that also includes other feature types, for example, isolated lines or spaces (not shown) or contact holes (not shown). The cited omitted mask feature types are not shown because they do not present the problem addressed by the present invention, i.e., the photoresist images of the omitted feature types when formed using phase shift masks, normally have enhanced resolution or Depth of Focus (DOF). The line/space array feature type, on the other hand, does not produce resist images of the same level of enhancement as the omitted feature types when using attenuated or rim phase-shift masks as is well-understood. Accordingly, the following description of the present invention presupposes that mask feature types other than those shown in the drawings may also be included in a given total mask pattern and if so, such feature types are left unchanged when they are incorporated into one of the substitute modified masks to be described.

In accordance with the preferred embodiment of the present invention, the line/space array is divided into two overlay groups. The letters "A" of FIG. 1 represent first overlay group of selected line portions (transparent lines). These line portions A are equally spaced from each other by an amount sufficient that they appear to be "isolated" lines with respect to each other, rather than lines of an "array", the former producing enhanced resist images relative to the latter. The letters "B" of FIG. 1 similarly represent second overlay group of selected line portions. These line portions B also are equally spaced from each other by an amount sufficient to make the selected lines appear to be "isolated" lines with respect to each other. It is to be understood that the shaded areas O are opaque areas of the phase shift mask.

Figure 2A:
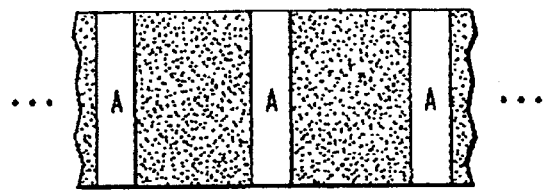
FIG. 2 are simplified plan views of a pair of modified masks to be substituted for the original mask of FIG. 1.
Figure 2B:
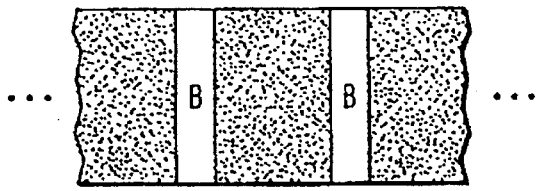

FIG. 2(A) depicts a first overlay mask of the preferred embodiment derived from the group A lines of FIG. 1. Similarly, FIG. 2(B) represents a second overlay mask of the preferred embodiment derived from the group B lines of FIG. 1. Again, the shaded areas are opaque in the overlay mask pair of FIGS. 2(A) and 2(B) while the lines "A" and "B" are transparent. In this example, the pattern is divided into two subpatterns. However, it is understood that the pattern could be divided into more than 2 subpatterns on more than 2 overlay masks by grouping the lines into more than 2 overlay groups. Further, such a division may be required as features become smaller and more enhancement becomes necessary. It is, therefore, intended that dividing the pattern into two groups serve only as an example and not as a limitation.

In the preferred embodiment mask pair of the present invention, any isolated features are included, unmodified, in the appropriate area of either of the overlay pair of masks of FIGS. 2A or 2B. For example, the isolated features could be included along with the group A lines on the overlay mask of FIG. 2A, with only the group B lines on the overlay masks of FIG. 2B. Alternatively, the mask of FIG. 2B could include group B lines and isolated shapes with only group A lines included on overlay mask of FIG. 2A. Thus, the entire pattern of the original mask is printed by successive exposure of the overlay mask patterns on to the photoresist.

The overlay masks are used in succession, in lieu of the original mask of FIG. 1, to expose resist (not shown) and to produce the respective latent image therein. The overlay masks are aligned during their respective exposure steps so that the resulting images are interleaved with respect to each other, whereby a total resultant latent image is produced in the exposed resist. The resultant image has the same pattern as shown in FIG. 1. However, since lines "A" and "B" were written as "isolated lines" on each of the overlay mask pair, the lines "A" and "B" were enhanced. The resultant array image is enhanced significantly over the image of the same array printed using the original prior art mask of FIG. 1.

Furthermore, because each overlay mask is individually aligned to the underlying pattern on the wafer, each shape of the resultant image is still within the same overlay objective as with the prior art mask of FIG. 1. Although as expected, there is some added alignment variation of the two overlay masks relative to each other, this variation is much less than that resulting from alignment of either overlay mask to the underlaying pattern. Consequently, the primary source of variation in alignment between the pair is due to the precision with which the wafer can be stepped. The variation in stepper consistency is typically small in state of the art steppers. Errors in mapping the underlying level, normally a substantial part of overlay error, do not affect relative alignment between the pair of masks.

A possible source of concern using the preferred embodiment is that attenuated PSMs have inherent low level transmittance through dark areas. Using the overlay mask pair of the present invention results in a double exposure of resist in dark areas over prior art attenuated single masks. This double exposure may impair the contrast between the dark areas versus the light (exposed) regions. This concern may be unfounded because with typical low transmittance of approximately 4% to 6%, the double exposure of the overlay mask pair dark areas is only approximately 8% to 12% background dosage. This background dosage is still well below the sensitivity level of state-of-the-art photoresists. However, optionally, this background dosage can be eliminated by using rim PSMs for each mask of the overlay pair instead of attenuated PSMs.

Figure 3:
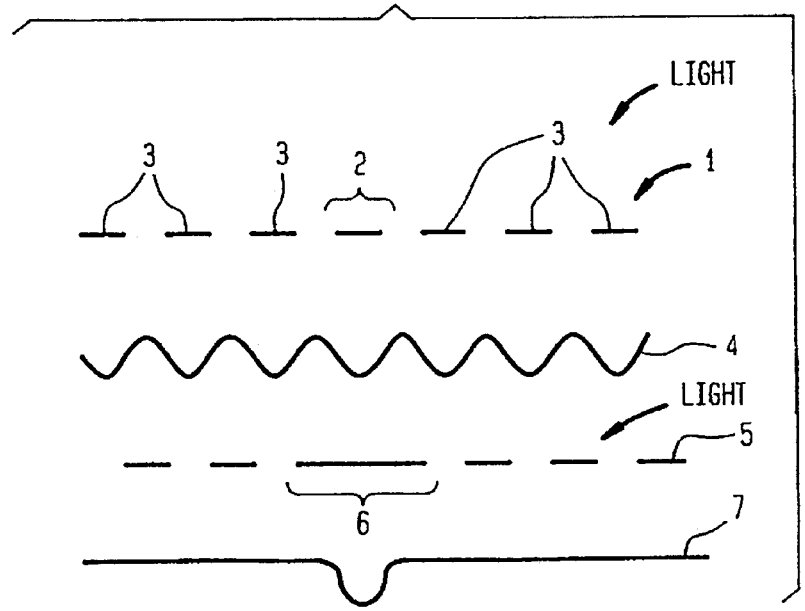
FIG. 3 is a simplified cross-sectional view of the substitute mask pair constructed in accordance with the present invention for use with an off-axis illumination technique.

FIG. 3 illustrates the preferred embodiment method of the present invention applied to off-axis illumination. As pointed out earlier, off-axis illumination, typically results in enhanced line/space arrays, but relatively unenhanced isolated features. Accordingly, in applying the preferred embodiment of the present invention to off-axis illumination, isolated features are modified to appear as arrays, as opposed to line/space arrays being modified to appear as isolated features.

In the example of FIG. 3, the isolated feature is the opaque line 2. Additional opaque "dummy" lines 3 have been added to the overlay pattern so that line 2 to form an overlay group of lines in an array constituting the overlay mask 1 of FIG. 3, rather than the single isolated line in original pattern, as it would have been printed on a prior art mask off-axis mask. Photoresist exposure from off-axis illumination of the overlay mask is represented by the cyclically repetitive (latent image) curve 4. Curve 4 also represents the intensity of the light (from the first exposure) transmitted between the opaque dummy lines 3 of mask 1 that produce a latent (aerial) image in the resist.

Overlay mask 5 is the second of the overlay mask pair of the present invention where the overlay group of dummy lines 3 of mask 1 are shifted by one half pitch. The true line 2 of mask 1 merges with adjacent shifted dummy lines in the overlay group to form extended line 6 of the second overlay mask 5. When the previously exposed photoresist pattern represented by curve 4 is subsequently exposed to off-axis illumination using overlay mask 5, the original pattern is printed in the resist as represented by the aerial latent image curve 7. As is apparent from the pattern of curve 7, the overlain area is uniformly exposed everywhere, except in the area corresponding to true line 2 of prior art mask 1. The group of dummy lines 3 from overlay mask 5 complement the group of dummy lines 3 of mask 1. Thus, all of the dummy features merge and are eliminated, such that only the true features are printed. Inasmuch as the edges of the true line 2 were exposed solely with mask 1 the resolution and DOF of line 2 are a function only of that exposure. Therefore, the true line 2 is enhanced with the line/space array features of the pattern despite the fact that line 2 actually is an isolated feature in the pattern. Depending on the resist type, an isolated line is printed (with negative resist) or an isolated space is printed (with positive resist).

In the above description of the preferred embodiment of the present invention, the features intended for enhancement are made to appear as features typically enhanced on one or both of the overlay mask pair. In the case of the mask pair of FIGS. 2(A) and 2(B), the images of the two substitute masks (1 and 5) are overlayed so that the patterns are interleaved with each other and the true image is printed in the photoresist. However, from the mask pair of FIG. 3, the dummy arrays of the two overlay masks merge together and eliminate one another, printing only the original isolated features.

The present invention also can be applied to other selective resolution or DOF enhancement methods to provide similar results. For example, other methods of resolution enhancement on which the present invention could be applied include diffraction grating masks, phase edge masks, or various types of expose tool resolution enhancements, such as pupil filters. Furthermore, the present invention can be applied to other feature types not described here. Such other feature types may include, for example, patterns required to define dynamic and static random access memory, e.g., active areas such as the storage plate, polysilicon word lines, or active area patterns, can be enhanced by using multiple exposures according to the present invention.

While the present invention is described in terms of preferred embodiments, numerous modifications and variations will occur to a person of ordinary skill in the art, it is intended that those variations and modifications fall within the appended claims.

What is claimed is:

1. A method of image enhancement of a pattern having diverse feature types, said method comprising:

grouping pattern shapes into a plurality of shape groups according to feature type, said plurality of shape groups including at least one enhanced feature group and at least one unenhanced feature group;

forming a plurality of overlay groups from at least one unenhanced feature group;

forming a plurality of overlay masks, each said overlay mask including a different one of said plurality of overlay groups, and, one of said overlay masks including said at least one enhanced feature group; and successively exposing the overlay masks on a photosensitive layer without intermediate development of the photosensitive layer.

2. The method of claim 1 wherein said plurality of shape groups is two shape groups, said plurality of overlay groups is 2 overlay groups, and said plurality of overlay masks is two masks.

3. The method of claim 2 wherein said 2 overlay groups is formed by replicating shapes in said unenhanced feature group into two arrays of said shapes, one said array in each said overlay group, whereby shapes in both said overlay groups interleave when said masks are overlain, cancelling said replicated shapes out and forming said pattern in a photoresistive layer.

4. The method of claim 3 wherein said overlay masks are off-axis illumination masks and said unenhanced feature type is an isolated feature type.

5. The method of claim 3 wherein said one of said overlay groups is formed by replicating isolated shapes in said unenhanced group on a predetermined pitch to form an array, and the second said overlay group is formed by replicating said isolated shapes and shifting said replicated isolated shapes by one half the pitch of replication.

6. The method of claim 2 wherein said 2 overlay groups are formed by grouping shapes in said unenhanced feature group into two subgroups, such that when said overlay masks are overlain, said two subgroups are interleaved, and pattern images in said unenhanced feature group are formed.

7. The method of claim 6 wherein said overlay masks are phase shift masks and said feature type is an array feature type.

8. The method of claim 6 wherein said overlay masks are attenuated phase shift masks.

9. The method of claim 6 wherein said overlay masks are Rim masks.

10. A method of semiconductor chip manufacture comprising:

forming a first portion of an array in a resist layer, said first portion comprising at least a first isolated image; and forming a second portion of an array in said resist layer, said second portion comprising at least a second isolated image, said second portion being interleaved with said first portion.

11. The method of claim 10 wherein a phase shift mask is used to expose said resist layer to form said first and second portions of said array.

12. A method of semiconductor chip manufacture comprising:

forming a first array layer in a resist layer; and forming a second array in said resist layer, said second array being interleaved with said first array such that said first and second arrays merge to form uniform exposure except in at least one predetermined area, said at least one predetermined area forming an isolated shape.

13. The method of claim 12 wherein each of said first and second arrays comprise at least one desired feature and at least one dummy feature, off-axis illumination is used to expose said resist layer to form said first and second arrays, and wherein said isolated shape corresponds to said desired pattern.

* * * * *